United States Patent
Cliff et al.

(10) Patent No.: US 6,396,304 B2
(45) Date of Patent: *May 28, 2002

(54) PROGRAMMABLE LOGIC ARRAY INTEGRATED CIRCUITS WITH BLOCKS OF LOGIC REGIONS GROUPED INTO SUPER-BLOCKS

(75) Inventors: Richard G. Cliff, Milpitas; Cameron McClintock, Mountain View; William Leong, San Francisco, all of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,285

(22) Filed: Dec. 9, 1999

Related U.S. Application Data

(63) Continuation of application No. 09/208,124, filed on Dec. 9, 1998, which is a division of application No. 08/672,676, filed on Jun. 28, 1996, now Pat. No. 5,909,126, which is a continuation-in-part of application No. 08/442,832, filed on May 17, 1995, now Pat. No. 5,543,732, which is a continuation-in-part of application No. 08/442,802, filed on May 17, 1995, now Pat. No. 5,541,530.
(60) Provisional application No. 60/015,267, filed on Apr. 11, 1996.

(51) Int. Cl.[7] .............................................. A03K 19/177
(52) U.S. Cl. ......................................... 326/41; 326/39
(58) Field of Search ..................................... 326/37–41

(56) References Cited

U.S. PATENT DOCUMENTS

| | | | |
|---|---|---|---|
| 3,473,160 A | 10/1969 | Wahlstrom | ............... 340/172.5 |
| 4,609,986 A | 9/1986 | Hartmann et al. | .......... 364/200 |
| 4,617,479 A | 10/1986 | Hartmann et al. | |

(List continued on next page.)

FOREIGN PATENT DOCUMENTS

| | | | |
|---|---|---|---|
| WO | WO 95/04404 | 9/1992 | ......... H03K/19/177 |

OTHER PUBLICATIONS

R. C. Minnick, "A Survey of Microcellular Research," Journal of the Association for Computing Machinery, vol. 14, No. 2, pp. 203–241, Apr. 1967.
S.E. Wahlstrom, "Programmable Logic Arrays—Cheaper by the Millions," Electronics, Dec. 11, 1967, pp. 90–95.
*Recent Developments in Switching Theory*, A. Mukhopadhyay, ed., Academic Press, New York, 1971, chapters VI and IX, pp. 229–254 and 369–422.
El Gamal et al., "An Architecture for Electrically Configurable Gate Arrays," IEEE Journal of Solid–State Circuits, vol 24, No. 2, Apr. 1989, pp. 394–398.
El–Ayat et al., "A CMOS Electrically Configurable Gate Array," IEEE Journal of Solid–State Circuits, vol. 24, No. 3, Jun. 1989, pp. 752–762.
"XC5000 Logic Cell Array Family, Technical Data, Advance Information," Xilinx, Inc., Feb. 1995.

*Primary Examiner*—Michael Tokar
*Assistant Examiner*—Don Phu Le
(74) *Attorney, Agent, or Firm*—Fish & Neave; Robert R. Jackson

(57) ABSTRACT

A programmable logic array integrated circuit device has logic regions grouped in blocks, which are in turn grouped in super-blocks. The super-blocks are disposed on the device in a two-dimensional array of intersecting rows and columns. Global conductors are associated with each row and column. Super-block feeding conductors associated with each super-block feed signals from the global conductors to any logic region in the super-block. Local feedback conductors feed back logic region output signals to all logic regions in a block. The super-block feeding conductors are also used to interconnect the logic regions in a super-block so that the global conductors do not have to be used for that purpose.

12 Claims, 3 Drawing Sheets

U.S. PATENT DOCUMENTS

| | | |
|---|---|---|
| 4,642,487 A | 2/1987 | Carter |
| 4,677,318 A | 6/1987 | Veenstra |
| 4,713,792 A | 12/1987 | Hartmann et al. ........... 364/900 |
| 4,758,745 A | 7/1988 | Elgamal et al. |
| 4,774,421 A | 9/1988 | Hartmann et al. |
| 4,871,930 A | 10/1989 | Wong et al. |
| 4,899,067 A | 2/1990 | So et al. |
| 5,121,006 A | 6/1992 | Pedersen |
| 5,220,214 A | 6/1993 | Pedersen |
| 5,225,719 A | 7/1993 | Agrawal et al. |
| RE34,363 E | 8/1993 | Freeman |
| 5,255,203 A | 10/1993 | Agrawal et al. ............ 364/489 |
| 5,260,610 A | 11/1993 | Pedersen et al. |
| 5,260,611 A | 11/1993 | Cliff et al. |
| 5,274,581 A | 12/1993 | Cliff et al. .................. 364/784 |
| 5,338,984 A | 8/1994 | Sutherland |
| 5,350,954 A | 9/1994 | Patel |
| 5,371,422 A | 12/1994 | Patel et al. .................... 326/41 |
| 5,455,525 A * | 10/1995 | Ho et al. ...................... 326/41 |
| 5,469,003 A | 11/1995 | Sean ........................... 326/39 |
| 5,543,732 A | 8/1996 | McClintock et al. ......... 326/41 |
| 5,592,106 A | 1/1997 | Leong et al. ................. 326/41 |
| 5,614,840 A | 3/1997 | McClintock et al. ......... 326/41 |
| 5,689,195 A | 11/1997 | Cliff et al. .................... 326/41 |

* cited by examiner

PROGRAMMABLE LOGIC ARRAY INTEGRATED CIRCUITS WITH BLOCKS OF LOGIC REGIONS GROUPED INTO SUPER-BLOCKS

CROSS REFERENCE TO RELATED APPLICATIONS

This application claims the benefit of U.S. provisional patent application No. 60/015,267, filed Apr. 11, 1996.

This is a continuation of application Ser. No. 09/208,124, filed Dec. 9, 1998, which is a division of application Ser. No. 08/672,676, filed Jun. 28, 1996, U.S. Pat. No. 5,909,126 which is a continuation-in-part of application Ser. No. 08/442,832, filed May 17, 1995 U.S. Pat. No. 5,543,732, and application Ser. No. 08/442,802, filed May 17, 1995 U.S. Pat. No. 5,541,530, all of which are hereby incorporated by reference herein in their entireties.

BACKGROUND OF THE INVENTION

This invention relates to programmable logic array integrated circuits, and more particularly to improved organizations of the logic regions and interconnection conductors of such devices.

Several different "architectures" for programmable logic array devices are known. Pedersen et al. U.S. Pat. No. 5,260,610, for example, shows programmable logic array devices in which blocks of programmable logic regions are disposed on the device in a two-dimensional array of intersecting rows and columns of such blocks. Each block includes a plurality of logic regions and a plurality of local feedback conductors for making the output of any logic region in the block selectively available as an input to any logic region in that block. Global horizontal conductors are associated with each row of blocks for conveying signals between the blocks in that row. Global vertical conductors are associated with each column of blocks for conveying signals from row to row.

The Pedersen et al. architecture has many advantages such as relatively high-speed signal conduction due to the continuous, long, global horizontal and vertical conductors. In some applications, however, this architecture may have certain disadvantages. For example, the blocks are relatively large (e.g., 16 logic regions each), so that relatively large numbers of programmable switches or connectors are required in the local feedback circuitry in each block to make the output of each region available as a possible input to any logic region in the block.

Another possible disadvantage is that any interconnection between blocks uses up at least one global conductor, even though the interconnection may be relatively short (e.g., just to an adjacent block). Also, because the logic region inputs are fed directly from the global horizontal conductors, each global horizontal conductor has many programmably switchable taps along its length. These taps cause significant loading of the global horizontal conductor circuits, which tends to increase the power required to drive those circuits, and which also tends to make those circuits not as fast as they would be with fewer programmable taps.

An architecture which addresses some of the possible disadvantages of the Pedersen et al. architecture is shown in Cliff et al. U.S. Pat. No. 5,260,611. The Cliff et al. architecture reduces the number of switchable taps on the global horizontal conductors by tapping those conductors to block input conductors associated with each block, the number of taps and the number of block input conductors associated with each block being less than the total number of inputs to the logic regions in the block. Each block input conductor is programmably selectively connectable to any logic region in the block, although the number of logic regions in each block is reduced from 16 to eight as compared to the Pedersen et al. architecture.

While the Cliff et al. architecture offers some possible improvements over the Pedersen et al. architecture, it does not improve on the Pedersen et al. architecture in other respects. The Cliff et al. architecture still requires an entire global horizontal or vertical conductor to be used for even relatively short interconnections between blocks. And the Cliff et al. architecture still requires that relatively large programmable connector matrices be provided in each block to make the output of each logic region in the block, as well as each block input conductor, available as an input to any logic region in the block. For example, to make any of eight logic region output signals and any of 24 block input conductors available as inputs to any of the four inputs of each of eight logic regions, a matrix of (8+24)×4×8=1024 programmable connectors is required for each block. In addition to these programmable connectors, other programmable connectors are required to connect the block input conductors to the global horizontal conductors, to apply the logic region outputs to the global horizontal and global vertical conductors, and to interconnect the global horizontal and global vertical conductors. None of these programmable connectors is typically performing any logic, and in all cases many of these connectors are unused.

A very different type of architecture is shown in Freeman U.S. Pat. No. Re. 34,363. In this architecture short interconnection conductors adjacent to each logic region are programmably interconnectable to one another to make interconnections between any but the most closely adjacent logic regions. A possible disadvantage of this architecture is that large numbers of short conductor segments must be "pieced together" to make long interconnections, which tend to be relatively slow due to the large number of programmable switches that the interconnection signal must pass through. More recent commercial products of Freeman's assignee, Xilinx, Inc., have added longer, uninterrupted conductors, and also uninterrupted conductors between adjacent logic regions (see, for example, Carter U.S. Pat. No. 4,642,487). However, these products still rely heavily on piecing together many relatively short interconnection conductor segments to make certain kinds of interconnections.

Another architecture which relies on programmably piecing together axially aligned and adjacent conductors to make longer conductors is shown in El Gamal et al., "An Architecture for Electrically Configurable Gate Arrays," IEEE Journal of Solid-State Circuits, Vol. 24, No. 2, April 1989, pp. 394–98; El-Ayat et al., "A CMOS Electrically Configurable Gate Array," IEEE Journal of Solid-State Circuits, Vol. 24, No. 3, June 1989, pp. 752–62; and Elgamal et al. U.S. Pat. No. 4,758,745). This architecture is not reprogrammable. Thus it uses one-time-only programmable connection elements that tend to be smaller and have less circuit loading and signal delay than typical reprogrammable connection elements. With such small one-time-only programmable elements it may be acceptable to provide excess interconnection capacity (e.g., regions of interconnection which are very densely or even fully populated with programmable connection elements) and to rely extensively on piecing together multiple short conductors to make longer conductors. But when a device is to be made reprogrammable, the larger size, loading, and delay of reprogrammable connection elements puts much greater pressure on the device designer to economize as much as possible on the use of such elements, without, of course, unduly sacrificing flexibility in the use of the resulting device. Similar economies are also of interest in connection with one-time-only programmable devices, especially as the logic capacity of those devices increases.

In view of the foregoing, it is an object of this invention to provide improved organizations for the logic regions and interconnection conductors of programmable logic array integrated circuit devices.

It is another object of this invention to provide programmable logic array integrated circuit devices having more effective signal routing, high speed, and greater logic capacity per unit of silicon area.

It is still another object of this invention to reduce the number of programmable switches or connectors that must be provided in programmable logic array devices, to reduce the number of global conductors that must be provided in such devices, and to avoid the piecing together of large numbers of short interconnections conductors that is characteristic of some prior devices.

SUMMARY OF THE INVENTION

These and other objects of the invention are accomplished in accordance with the principles of the invention by providing programmable logic array integrated circuit devices in which the blocks of logic regions are grouped together in super-blocks of several (e.g., four) blocks each. The super-blocks are typically disposed on the integrated circuit in a two-dimensional array of intersecting rows and columns. Global horizontal conductors are associated with each row of super-blocks for making interconnections between super-blocks in the associated row. Global vertical conductors are associated with each column of super-blocks for making interconnections between the rows.

Each block has local feedback conductors for making the outputs of the logic regions in that block available to the inputs of the logic regions in the block. The outputs of the logic regions in each super-block are also applied to inter-block conductors associated with that super-block in order to facilitate application of the outputs of the logic regions of each block to the logic regions of other blocks in the same super-block.

Super-block feeding conductors associated with each super-block allow signals on the associated global horizontal conductors to enter the super-block. These super-block feeding conductors can also receive the signals on the inter-block conductors associated with the super-block. Programmable switch or logic connector matrices are associated with each super-block for selectively connecting the inputs of each logic region in the super-block to the associated super-block feeding conductors and also to the local feedback conductors of the block which includes that logic region. The inter-block conductors are additionally used to convey signals out of each super-block to the global horizontal and vertical conductors.

Because of the availability of alternate local feedback routes through the inter-block and super-block feeding conductors, the programmable logic connector matrices connecting the logic region inputs to the associated local feedback conductors can be less than fully populated. This saves a considerable number of programmable logic connectors. The provision of the inter-block conductors greatly reduces the need for global conductors to make connections between blocks. The use of one set of super-block feeding conductors to feed several blocks (e.g., the four blocks in a super-block) makes more efficient use of this type of resource.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
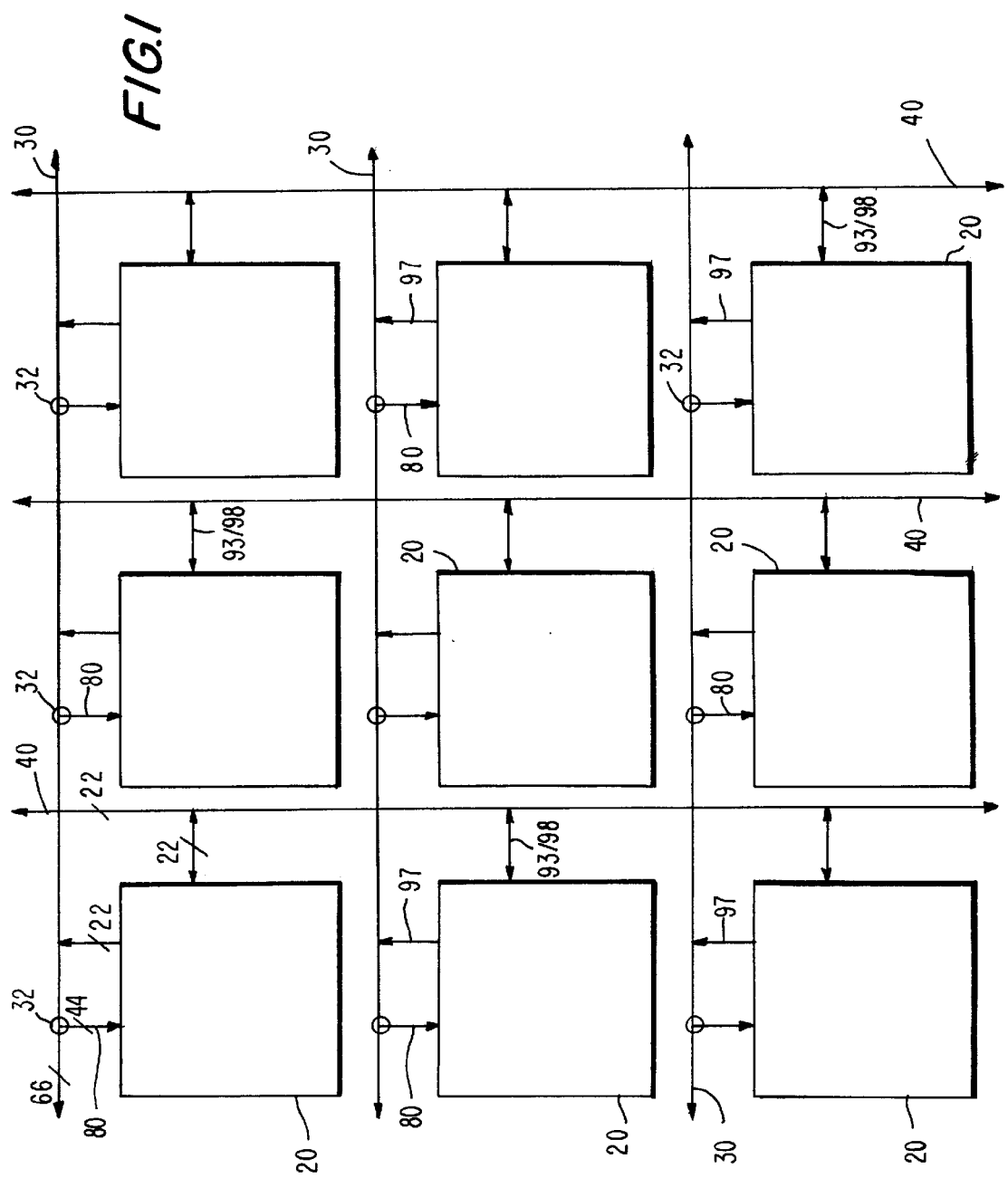
FIG. 1 is a simplified schematic block diagram of a portion of an illustrative programmable logic array integrated circuit device constructed in accordance with the principles of this invention.

As shown in FIG. 1, an illustrative programmable logic array integrated circuit device 10 constructed in accordance with the principles of this invention includes a two-dimensional array of super-blocks 20 of regions of programmable logic. Super-blocks 20 are disposed on device 10 in three intersecting rows and columns of three super-blocks each. A plurality of global horizontal conductors 30 is associated with each row. In the illustrative embodiment shown, there are 66 such global horizontal conductors 30 associated with each row. A plurality of global vertical conductors 40 is associated with each column. In the illustrative embodiment shown, there are 22 global vertical conductors 40 associated with each column.

Figure 2:
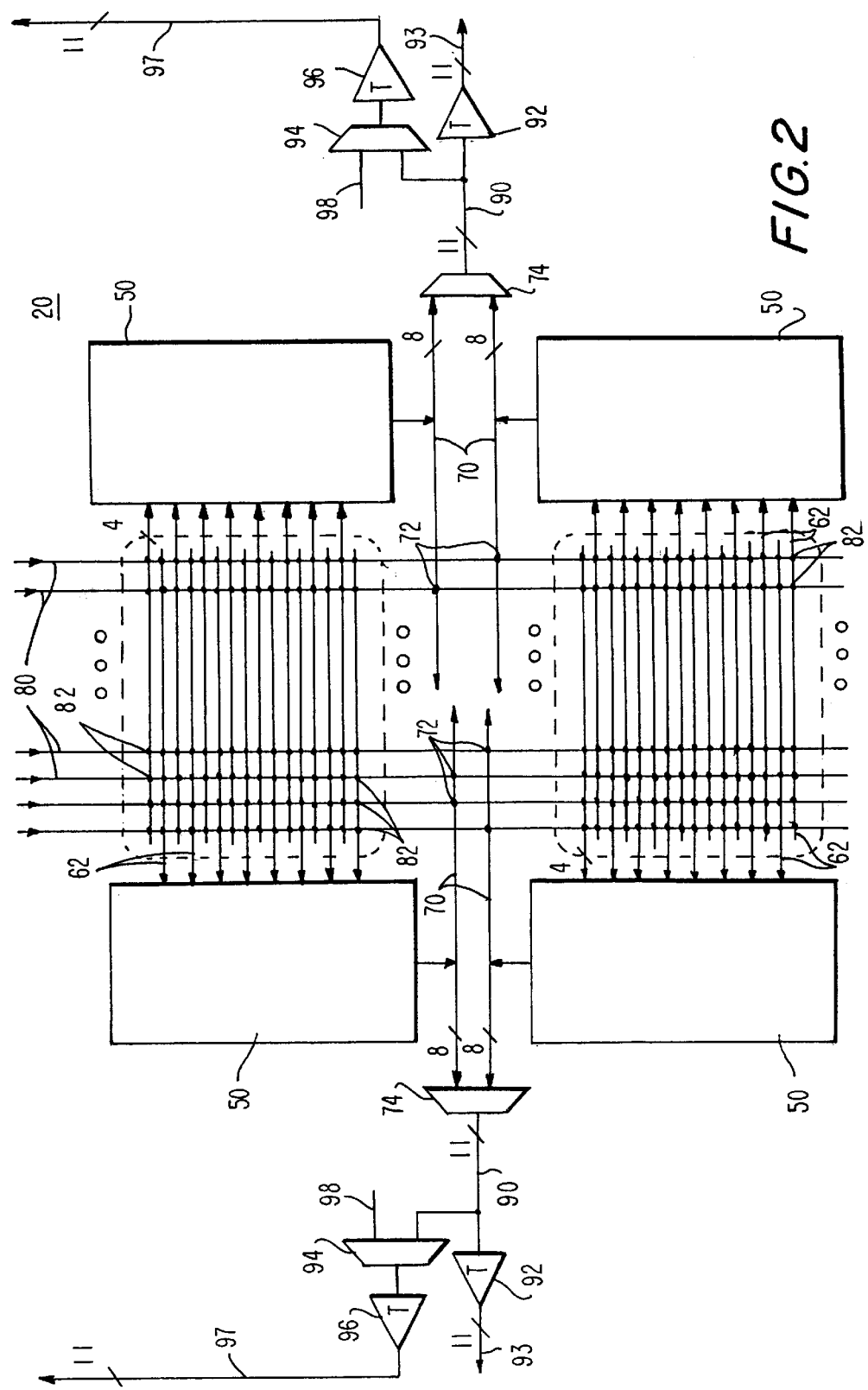
FIG. 2 is a more detailed, but still simplified, schematic block diagram of a representative portion of the apparatus shown in FIG. 1.

The construction of a representative super-block 20 is shown in more detail in FIG. 2. As FIG. 2 shows, each super-block includes four programmable logic region blocks 50, a representative one of which is shown in more detail in FIG. 3. Each block 50 includes eight regions 60 of programmable logic. Although other constructions of logic regions 60 are possible, in the depicted preferred embodiment each region 60 includes a universal logic block ("ULB") (e.g., a look-up table) which is programmable to produce as an output signal 64 any logical combination of four inputs 62 to the ULB. Each region 60 may also include a flip-flop-type device for registering the output of the ULB, and programmable circuitry for allowing the final output of the logic region to be either the unregistered output of the ULB or the output of the flip-flop-type device. The flip-flop-type device may have clock, clear, and preset inputs, and the logic region may include specialized circuitry to perform arithmetic and/or counter functions associated with some or all of the ULB inputs. An example of a logic region having all of the foregoing characteristics is shown in Cliff et al. U.S. Pat. No. 5,274,581.

The above-described construction of logic regions 60 is only illustrative, and those skilled in the art will appreciate that many other logic region constructions are possible. For example, logic regions 60 could alternatively be implemented as product-term-based macrocells.

Figure 3:
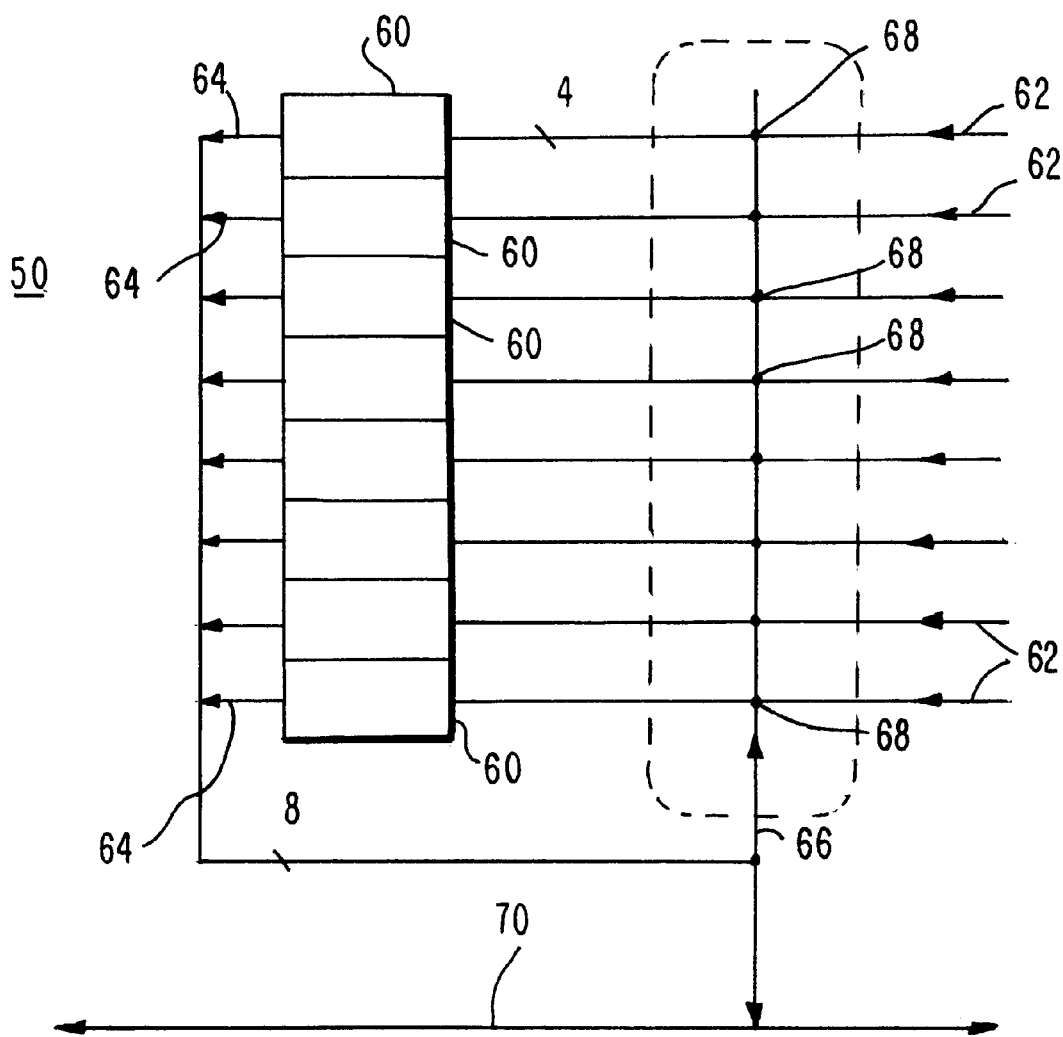
FIG. 3 is a more detailed, but still simplified, schematic block diagram of a representative portion of the apparatus shown in FIG. 2.

As FIG. 3 shows, each block 50 includes local feedback conductors 66 for making the outputs 64 of the logic regions in that block available as inputs to the logic regions in the block. Programmable logic connectors ("PLCs") 68 (controlled by programmable memory elements such as random access memory ("RAM") cells on device 10) are provided for selectively connecting local feedback conductors 66 to logic region input conductors 62. Although other population densities are possible for the inputs to PLCs 68, in the depicted preferred embodiments each PLC 68 has a sufficient number of inputs to make half the possible connections between the eight local feedback conductors 66 and the associated region input conductor 62. These PLC 68 inputs for an entire block are preferably distributed evenly among all the conductors 66 associated with that block. Thus each conductor 66 has two chances for connection to the inputs to each logic region 60, and each logic region input conductor 62 is connectable to four of the eight local feedback conductors 66. The crosspoint region between conductors 66 and conductors 62 may therefore be referred to as "half populated". This greatly reduces the number of PLC inputs in the local feedback circuitry of block 50 as compared to the fully populated interconnection in the feedback circuitry of such prior architectures as are shown in Pedersen et al. U.S. Pat. No. 5,260,610 and Cliff et al. U.S. Pat. No. 5,260,611.

PLCs 68 (and other PLCs used throughout device 10) can be implemented in any of many different ways. For example, each PLC can be a relatively simple programmable connector such as a switch or a plurality of switches for connecting an input or any one of several inputs to an output. Or each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Because the connection capabilities of PLCs tend to be of basic importance in relation to the present invention, these devices will sometimes be referred to herein as switches or the like, even though it will be understood that in some embodiments the PLCs may additionally perform logic as has been explained. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not separately shown in the drawings. (With certain PLC implementations (e.g., fuses and metal optional links) separate FCE devices are not required.) FCEs can also be implemented in any of several different ways. For example, FCEs can be SRAMS, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these various technologies can also be used for the programmable memories of the ULBs. Thus this invention is applicable both to one-time-only programmable devices and to reprogrammable devices. However, the especially preferred embodiments are reprogrammable because reprogrammable devices tend to benefit more from the economies of interconnection resources which result from use of this invention.

FIG. 3 further shows that the outputs 64 of logic regions 60 in each block 50 are also applied to inter-block conductors 70 that are associated with the super-block 20 which includes that block.

Returning to the discussion of FIGS. 1 and 2, each super-block 20 receives signals from the associated global horizontal conductors 30 via 44 super-block feeding conductors 80 that serve that super-block. Conductors 80 receive signals from conductors 30 via PLCs 32. Again, although other densities of interconnections 32 are possible, in the depicted preferred embodiment each conductor 30 has four chances for connection to the conductors 80 feeding each super-block 20 associated with that conductor. These possible connections are distributed evenly over the conductors 80 associated with each super-block.

Super-block feeding conductors 80 are selectively connectable to logic region input conductors 62 by PLCs 82. The density of the inputs to PLCs 82 is similar to the density previously described for PLCs 68 (although PLCs 82 could have a different input density if desired). Thus the intersections of conductors 80 and 62 are 50% populated with possible interconnections 82. Each of conductors 80 therefore has two chances to get into each of the 32 logic regions 60 in the associated super-block 20. The interconnections that PLCs 82 can make are preferably distributed uniformly among the 128 logic region input conductors 62 and the 44 super-block feeding conductors 80 in the super-block.

Super-block feeding conductors 80 can also receive output signals of the logic regions 60 in the super-block associated with those conductors. This is accomplished via the above-mentioned inter-block conductors 70 and PLCs 72, which selectively connect conductors 70 to conductors 80. This signal routing allows the output of any logic region 60 in a super-block 20 to be made available as an input to any logic region in that super-block without having to go outside the super-block to make the interconnection. In particular, it is not necessary to use any of global conductors 30 and 40 to make interconnections among the logic regions 60 in a super-block 20. Again, different densities of PLCs 72 can be used if desired, but in the depicted preferred embodiment each of the 32 inter-block conductors 70 is connectable to a respective one of conductors 80 via a switch 72.

Inter-block conductors 70 are also used as the conduit by which the output signals of the logic regions 60 in each super-block 20 can exit from the super-block. As viewed in FIG. 2, each of the 16 logic region output signals of the two left-hand blocks 50 can be applied to any one of the 11 conductors 90 that extend to the left from the left-hand PLC 74 in FIG. 2. Similarly, each of the 16 logic region output signals of the two right-hand blocks 50 can be applied to any one of the 11 conductors 90 that extend to the right from the right-hand PLC 74 in FIG. 2. Each of conductors 90 can drive a respective one of the 22 global vertical conductors 40 associated with the super-block that includes those conductors 90 via tri-state drivers 92 (which are a form of PLC) and conductors 93. The states of drivers 92 are programmably controlled in the same way that the various PLCs are controlled. Each of conductors 90 can alternatively or additionally drive a respective one of the global horizontal conductors 30 associated with the super-block that includes those conductors 90 via a PLC 94, a tri-state driver 96, and a conductor 97. Drivers 96 are programmably controlled in the same manner as drivers 92. Elements 94 and 96 can alternatively be used to connect global vertical conductors 30 associated with a super-block to global horizontal conductors 40 that are also associated with that super-block. (Connections 98 from conductors 30 are used as part of these circuit paths.) This permits communication of signals between the rows on device 10. (It will be understood that each element 92, 94, and 96 shown in FIG. 2 actually represents 11 such elements. Each of elements 94 has two inputs 98 in addition to its one input 90.)

Connections to and from chip 10 are made via PLCs and/or programmable tri-state drivers connected between conductors 30 and 40 and input and/or output pads disposed along the edges of the chip. This is not shown herein, but it may be similar to what is shown, for example, in FIGS. 6a and 6b of Cliff et al. U.S. Pat. No. 5,260,611. Also, although not shown herein, it will be apparent to those skilled in the art that additional conductors can be provided on device 10 to supply various clock, clear, preset, etc. signals to logic regions 60.

The operation and advantages of the foregoing structure will be apparent from what has been said regarding it. The formation of the super-blocks uses many fewer FCE bits and interconnection wires than four blocks not formed into a super-block as in the above-mentioned Cliff et al. architecture. This translates to a smaller layout area for the same amount of programmable logic. The trade off for this is some reduction in the flexibility of interconnect within the super-block. This is compensated for by creating more flexibility in getting signals to the super-block by allowing each global horizontal conductor 30 four ways into the super-block. The FCE and interconnection cost for this increased flexibility is small compared to savings by using the super-block.

Because communication within the super-block does not require the use of global horizontal conductors, fewer such conductors are needed as compared to the above-mentioned Pedersen et al. and Cliff et al. architectures. This communication, on shorter inter-block conductors 70, is faster than if a global horizontal conductor were needed as in the prior architectures. In comparison to the above-mentioned Freeman et al. architecture, the present architecture is faster because there is no stitching of lines together, which adds RC loading and losses, and which slows signal propagation. The same is true of a comparison between the present architecture and the architecture shown in the above-mentioned El Gamal, El-Ayat, and Elgamal references.

The density of the population of PLCs 68 between local feedback conductors 66 and logic region input conductors 62 can be much less (illustratively one-half) the density of the approximately analogous PLCs in the above-mentioned Pedersen et al. and Cliff et al. architectures. The PLC population density between conductors 80 and 62 is similarly reduced as compared to the functionally approximately similar portions of the Cliff et al. architecture.

Conductors 80 serve multiple blocks 50 of logic regions, rather than just one block as in the Cliff et al. architecture. This makes more efficient use of these conductors and the PLCs 32 that drive them. Conductors 80 are also put to additional uses including (1) providing additional paths for local feedback within a block, and (2) providing interconnections between the blocks 50 in a super-block 20. As has been said, this latter feature reduces the need to use long global conductors 30 and 40 to make interconnections between adjacent blocks 50.

Still another advantage of the structures of this invention is the greater sharing of the resources used to selectively connect the logic region outputs 64 to global conductors 30 and 40. Instead of each logic region having its own dedicated set of output circuits, many of these components are now shared by several logic regions. Thus, for example, 11 drivers 92 and 96 are shared by 16 logic regions, thereby reducing the number of such drivers that must be provided.

It will be understood that the foregoing is only illustrative of the principles of the invention, and that various modifications can be made by those skilled in the art without departing from the scope and spirit of the invention. For example, the number of logic regions 60 per block 50 can be changed if desired. The number of blocks 50 per super-block 20 can also be changed if desired. The total number of super-blocks 20 can also be changed, as can the numbers of rows and columns of super-blocks. Changes of the type suggested above may necessitate different numbers of global conductors 30 and/or 40, different numbers of super-block feeding conductors 80, different numbers of inter-block conductors 70, different numbers of local feedback lines 66, etc. Different PLC population densities may also be used. Logic regions 60 may also be constructed differently than has been described for the illustrative embodiment.

The invention claimed is:

1. A programmable logic array integrated circuit device comprising:
   a plurality of logic regions, each of which has a plurality of input terminals and at least one output terminal, and each of which is programmable to produce at its output terminal an output logic signal which is any of a plurality of logic functions of input logic signals applied to its input terminals, said logic regions being grouped in a plurality of blocks such that each of said blocks includes a respective sub-plurality of adjacent ones of said logic regions, and said blocks being grouped in a plurality of super-blocks such that each of said super-blocks includes a respective sub-plurality of adjacent ones of said blocks;
   a plurality of inter-super-block circuits configured to convey signals between the super-blocks;
   a plurality of super-block-feeding circuits associated with each of said super-blocks and disposed adjacent the logic regions of the associated super-block;
   a first programmable logic connector array associated with each of said pluralities of super-block-feeding circuits and configured to selectively connect said super-block-feeding circuits to the inter-super-block circuits; and
   a second programmable logic connector array associated with each of said pluralities of super-block-feeding circuits and configured for selective connection of said super-block-feeding circuits to the input terminals of the logic regions in the super-block with which said super-block-feeding circuits are associated, each such connection requiring only a single conductor and a single programmable logic connector.

2. A programmable logic device comprising:
   a plurality of repetitions of all elements defined in claim 1; and
   interconnection circuitry configured to convey signals between said repetitions.

3. The device defined in claim 1 further comprising:
   a third programmable logic connector array associated with each of said super-blocks and configured to selectively connect the output terminals of the logic regions in said super-block to the inter-super-block circuits.

4. The device defined in claim 1 wherein the super-blocks are disposed on the device in a two-dimensional array of intersecting rows and columns of said super-blocks.

5. The device defined in claim 2 wherein each of said repetitions is disposed on the device in a respective one of a plurality of rows, and wherein the interconnection circuitry includes conductors that extend transverse to said rows.

6. The device defined in claim 5 wherein the inter-super-block circuits in each of said repetitions include additional conductors that extend substantially parallel to the rows.

7. A programmable logic array integrated circuit device comprising:
   a plurality of logic regions, each of which has a plurality of input terminals and at least one output terminal, and each of which is programmable to produce at its output terminal an output logic signal which is any of a plurality of logic functions of input logic signals applied to its input terminals, said logic regions being grouped in a plurality of blocks such that each of said blocks includes a respective sub-plurality of adjacent ones of said logic regions, and said blocks being grouped in a plurality of super-blocks such that each of said super-blocks includes a respective sub-plurality of adjacent ones of said blocks;

a plurality of inter-super-block circuits configured to convey signals between the super-blocks;

a plurality of super-block-feeding circuits associated with each of said super-blocks and disposed adjacent the logic regions of the associated super-block;

a first programmable logic connector array associated with each of said pluralities of super-block-feeding circuits and configured to selectively connect said super-block-feeding circuits to the inter-super-block circuits;

a second programmable logic connector array associated with each of said pluralities of super-block-feeding circuits and configured to selectively connect said super-block-feeding circuits to the input terminals of the logic regions in the super-block with which said super-block-feeding circuits are associated; and a plurality of local feedback circuits associated with each of said super-blocks and configured to locally feed back to input terminals of the logic regions in said super-block the output logic signals of the logic regions in said super-block.

8. The device defined in claim 7 further comprising:

a third programmable logic connector array associated with each of said super-blocks and configured to selectively connect the output terminals of the logic regions in said super-block to the inter-super-block circuits.

9. The device defined in claim 7 wherein the super-blocks are disposed on the device in a two-dimensional array of intersecting rows and columns of said super-blocks.

10. A programmable logic device comprising:

a plurality of repetitions of all elements defined in claim 7; and interconnection circuitry configured to convey signals between said repetitions.

11. The device defined in claim 10 wherein each of said repetitions is disposed on the device in a respective one of a plurality of rows, and wherein the interconnection circuitry includes conductors that extend transverse to said rows.

12. The device defined in claim 11 wherein the inter-super-block circuits in each of said repetitions include additional conductors that extend substantially parallel to the rows.

* * * * *